United States Patent [19]
Stoner et al.

[11] Patent Number: 6,127,768
[45] Date of Patent: Oct. 3, 2000

[54] SURFACE ACOUSTIC WAVE AND BULK ACOUSTIC WAVE DEVICES USING A $ZN_{(1-x)}Y_xO$ PIEZOELECTRIC LAYER DEVICE

[75] Inventors: Brian R. Stoner, Chapel Hill; Robert B. Henard, Raleigh; David L. Dreifus; Bradley A. Fox, both of Cary, all of N.C.

[73] Assignee: Kobe Steel USA, Inc., Research Triangle Park, N.C.

[21] Appl. No.: 09/073,995

[22] Filed: May 7, 1998

Related U.S. Application Data

[60] Provisional application No. 60/046,009, May 9, 1997.

[51] Int. Cl.$^7$ .............................. H03H 9/25; H01L 41/04
[52] U.S. Cl. .................................. 310/313 A; 310/313 R
[58] Field of Search ............................. 310/313 A, 313 R

[56] References Cited

U.S. PATENT DOCUMENTS

| | | | |
|---|---|---|---|
| 4,151,324 | 4/1979 | Ogawa et al. | 428/432 |
| 4,164,676 | 8/1979 | Nishiyama et al. | 310/360 |
| 4,174,421 | 11/1979 | Nishiyama et al. | 428/432 |
| 4,182,793 | 1/1980 | Nishiyama et al. | 428/432 |
| 4,205,117 | 5/1980 | Nishiyama et al. | 428/411 |
| 4,219,608 | 8/1980 | Nishiyama et al. | 428/411 |
| 4,229,506 | 10/1980 | Nishiyama et al. | 428/539 |
| 4,692,653 | 9/1987 | Kushida et al. | 310/334 |
| 5,160,869 | 11/1992 | Nakahata et al. | 310/313 A |
| 5,432,397 | 7/1995 | Koike et al. | 310/358 |
| 5,446,330 | 8/1995 | Eda et al. | 310/313 R |
| 5,532,537 | 7/1996 | Koike et al. | 310/313 A |
| 5,576,589 | 11/1996 | Dreifus et al. | 310/313 A |
| 5,739,563 | 4/1998 | Kawakubo et al. | 257/295 |

FOREIGN PATENT DOCUMENTS

| | | | |
|---|---|---|---|
| 0 313 025 A2 | 4/1989 | European Pat. Off. | H03H 9/02 |
| WO 96/12344 | 4/1996 | WIPO | H03H 9/02 |

OTHER PUBLICATIONS

Nakagawa et al., "Control of Second–Order Temperature Coefficients of Delay Time for SAW Propagating in Thin–Film Layers," *Electronics & Communications in Japan,* Part III—Fundamental Electronic Science, vol. 77, No. 4, Apr. 1, 1994, pp. 89–98.

International Search Report, PCT/US98/09457, dated Sep. 3, 1998.

F. S. Hickernell; ZnO Processing For Bulk—And Surface–Wave Devices; *Ultrasonics Symposium Proceedings* pp. 1–10 (Dec. 1980).

A. Hachigo et al.; Heteroepitaxial growth of ZnO films on diamond (111) plane by magnetron sputtering; *Appl. Phys. Lett.* 65(20):2556–2558 (Dec. 1994).

F.S. Hickernell; An Optical Measure of the Acoustic Quality of Zinc OxideTthin Films, *Ultrasonics Symposium* pp. 932–935 (Dec. 1979).

T. Shiosaki; High–speed Fabrication of High–Quality Sputtered ZnO Thin–Films for Bulk and Surface Wave Application *Ultrasonics Symposium* pp. 100–110 (Dec. 1978).

A. J. Slobodnik, Jr.; The Temperature Coefficients of Acoustic Surface Wave Velocisty and Delay on Lithium Niobate, Lithium Tantalate, Quartz and Tellurium Dioxide *Air Force Cambridge Research Laboratoriy* pp. 1–116 (Dec. 1974).

M. Kadota; Combination of ZnO Film and Quartz to Realize Large Coupling Factor and Excellent Temperature Coefficient for SAW Devices *IEEE Ultrasonics Symposium* pp. 261–266 (Dec. 1997).

F. S. Hickernell et al.; The Experimental and Theoretical Characterization of SAW Modes on ST–X Quartz with a Zinc Oxide Film Layer *IEEE International Frequency Control Symposium* 852–857 (Dec. 1997).

H. Nakahata et al.; SAW Devices on Diamond; *IEEE Ultrasonic Symposium* pp. 1–10 (Dec. 1995).

*Primary Examiner*—Thomas M. Dougherty
*Attorney, Agent, or Firm*—Myers Bigel Sibley & Sajovec, PA

[57] ABSTRACT

The SAW device comprises a diamond or quartz substrate as a wave propagation layer, a piezoelectric layer on the wave propagation layer and at least one interdigitated electrode on the piezoelectric layer.

8 Claims, 3 Drawing Sheets

SURFACE ACOUSTIC WAVE AND BULK ACOUSTIC WAVE DEVICES USING A $ZN_{(1-x)} Y_xO$ PIEZOELECTRIC LAYER DEVICE

This application claims the benefit of U.S. Provisional Patent Application No. 60/046,009 filed May 9, 1997; the disclosure of which is incorporated herein by reference in its entirety.

FIELD OF THE INVENTION

The present invention relates to semiconductor devices, and more particularly, to surface acoustic wave (SAW) devices and bulk acoustic wave (BAW) devices.

BACKGROUND OF THE INVENTION

Surface Acoustic Wave (SAW) devices are semiconductor devices that use surface acoustic waves whose energy is transmitted convergently on the surface of a solid. In general, a SAW device includes a layer of a piezoelectric material and one or more interdigitated transducer (IDT) electrodes formed on the piezoelectric layer. The surface acoustic wave may be excited by applying an electrical signal to an IDT electrode. Electrical signals are correspondingly generated across an opposite IDT electrode as surface acoustic waves pass the electrode. Typical piezoelectric materials include bulk monocrystals of quartz, as well as layers of $LiNbO_3$, $LiTaO_3$, AlN, or ZnO grown on a substrate. In a bulk acoustic wave (BAW) device, the energy of the acoustic waves may be transmitted through the solid, i.e., normal to the solid surface, or parallel to the surface. Both types of devices are often utilized for various signal processing applications. Surface acoustic wave devices are also used for sensor applications. The core components of these devices include the following: (a) piezoelectric layer to support acousto-electric transduction, (b) metal electrodes to trigger acousto-electric transduction in the piezoelectric layer, and (c) a medium for acoustic wave propagation.

In general, the active frequency (f) of a surface acoustic wave device is determined by the formula $f=v/\lambda$, where $\lambda$ is the wavelength and v is the propagation velocity of the surface acoustic wave in the piezoelectric material. The wavelength $\lambda$ is dependent on the spacing frequency of the interdigitated electrodes and the crystal orientation of the surface of the material through which the wave passes. Typical propagation velocities v for exemplary materials are as follows: 350 m/sec to 4000 m/sec for a monocrystalline $LiNbO_3$ layer, and 3300 m/sec to 340 m/sec for a monocrystalline $LiTaO_3$ layer. The propagation velocity v is relatively high at approximately 3000 m/sec for a ZnO film on a glass substrate.

The active frequency f can be increased either by increasing the propagation velocity v or by decreasing the wavelength $\lambda$. Unfortunately, the propagation velocity is restricted by the material properties of the piezoelectric layer. The wavelength $\lambda$, which is determined by the width, spacing, and arrangement of the IDT electrodes, is limited by the lower limits of existing processing technologies. In a typical interdigitated electrode having an array of alternating equally spaced electrode fingers with a common width w and a common spacing s, for example, the wavelength is determined by the formula $\lambda=2s+2w$. Other electrode arrangements will have other relationships between the wavelength, electrode width, and electrode spacing.

Submicron geometries may be difficult to fabricate using conventional materials, and long term reliability is typically limited by metal migration effects. For example, many existing optical lithography technologies cannot be used to fabricate a line/groove structure having a width of less than 0.8 microns. In addition, a narrower line width lowers the fabrication yield. For these reasons, the maximum frequency of many existing SAW devices in practical use is approximately 900 MHz. A surface acoustic wave device having interdigitated electrodes on a $LiNbO_3$ substrate may have a surface acoustic wave velocity of 4003.6 m/s, a coupling coefficient of 5.57%, and a frequency temperature coefficient of −72 ppm/K, for example. In a device having alternating equally spaced interdigitated electrodes with 1 $\mu$m wide electrodes and 1 $\lambda$m spaces between electrodes, the frequency will be approximately 1.0 GHz. In order to achieve a 2.5 GHz device, the electrodes should have a width and spacing of approximately 0.4 $\mu$m.

In the case of SAW devices including a piezoelectric film on a substrate, plural surface acoustic waves are excited if the sound velocity of the substrate is different than the surface acoustic wave velocity of the piezoelectric film. These surface acoustic waves are called zeroth mode waves, first mode waves, second mode waves, etc. according to the order of increasing velocity. The velocities of all modes depend on the substrate, as well as the piezoelectric film. The use of substrates having higher sound velocities results in higher velocities for all modes of the surface acoustic wave in the device. That is, the surface acoustic wave velocity increases in proportion to the sound velocity of the substrate.

Unilayer SAW devices are particularly limited in high frequency performance since state-of-the-art piezoelectric materials do not have sufficient SAW velocities to enable devices to be realized for GHz applications. Many materials that have sufficient SAW velocities are non-piezoelectric and hence cannot serve directly as acousto-electric transducers. The high SAW velocity of a non-piezoelectric material can be exploited by placing a piezoelectric layer on the surface of the non-piezoelectric (i.e. by utilizing multilayer SAW structures). By placing metal electrodes at either surface of the piezoelectric layer, a SAW can be launched in the multilayer structure. Such multilayer structures will allow acousto-electric transduction via the piezoelectric layer. The resultant wave will propagate in the multilayer structure and will be transduced at the receiver via reciprocity as in standard unilayer SAW devices. Thus, multilayer structures employ non-piezoelectric layers with high acoustic velocities to extend the high frequency operation limits imposed by existing lithographic constraints. A multilayer surface acoustic wave device is disclosed, for example, in a reference by Shiosaki et al. entitled *High-Coupling and High-Velocity SAW Using ZnO and AlN Films on a Glass Substrate*, and appearing in IEEE Transactions on Ultrasonics, Ferroelectrics, and Frequency Control, Vol. UFFC-33, No. 3, May 1986. The SAW device disclosed by the Shiosaki et al. reference includes a borosilicate glass sheet substrate, a C-axis-oriented AlN film on the substrate, and a C-axis-oriented polycrystalline ZnO film on the AlN film opposite the substrate. Aluminum IDT electrodes are included between the AlN and the ZnO films. With this structure, a maximum coupling coefficient of 4.37% was reportedly obtained where the phase velocity was 5840 m/s. The frequency temperature coefficient of this device was 21.0 ppm/° C. at 25° C. The phase velocity of this device, however, is still relatively low. Accordingly, high frequency performance is limited.

A surface acoustic wave device having a relatively higher propagation velocity is disclosed in U.S. Pat. No. 5,221,870 to Nakahata et al. The patent discloses a SAW device having a silicon semiconductor substrate, a diamond film on the substrate, a ZnO piezoelectric layer on the diamond layer, and interdigitated transducer electrodes on the piezoelectric layer. For the diamond film, both a single crystal and polycrystalline diamond film are suitable. However, a monocrystalline film is more favorable, because there is less acoustic scattering in monocrystalline diamond as compared to polycrystalline diamond.

Diamond is a preferred material for many semiconductor devices because of its hardness, relatively large bandgap, high temperature performance, high thermal conductivity, and radiation resistance. Moreover, diamond is desirable for SAW devices because it has relatively large values of acoustic velocities. See, for example, "*SAW Propagation Characteristics and Fabrication Technology of Piezoelectric Thin Film/Diamond Structure*", by Yamanouchi et al., 1989 Ultrasonics Symposium, pp. 351–354, 1989. Combining diamond with relatively low velocity piezoelectric materials also results in higher SAW velocities; thus, the demands on line spacing may be reduced for a given frequency of operation as disclosed, for example, in "*High Frequency Bandpass Filter Using Polycrystalline Diamond*", by Shikata et al., Diamond and Diamond Related Materials, 2(1993), pp. 1197–1202.

Moreover, although the surface orientation of diamond will affect the absolute values of acoustic wave propagation, on average, longitudinal waves propagate at 18,000 m/s, shear waves at 12,000 m/s, and surface acoustic waves at 11,000 m/s. The SAW velocity in diamond is about three times higher than in LiNbO$_3$. In particular, a 2.4 Gigahertz (GHz) diamond device using a $\lambda_o/4$ design would require a one micron line and spacing geometry. Thus larger feature sizes can be used with diamond to fabricate devices that operate at frequencies in excess of 2.5 GHz. In contrast, 0.25–0.5 micron feature sizes would be required in devices fabricated from conventional SAW materials. Since the feature size of diamond-based devices can be larger than in other materials, current IDT feature sizes can be used, and advanced lithography tools are typically not required for device fabrication. Metal migration effects are also minimized in high frequency SAW devices. The ability to fabricate devices that can operate at frequencies in excess of 1.0 GHz without requiring submicron technology greatly increases yield and quality and decreases concomitant manufacturing costs.

The high acoustic velocity of diamond based devices is also advantageous for bulk acoustic wave BAW devices. As an example, in the resonator structure, as the frequency of operation increases the layer thickness decreases. For conventional materials, the thicknesses are too thin to be manufactured since they are not mechanically robust enough to be handled. For diamond BAW's operating at high frequency operation, the high velocity of diamond allows for thicker devices that have additional mechanical robustness than conventional materials.

One specific structure proposed for realizing high frequency SAW devices using diamond includes the use of ZnO. This is more fully described in U.S. Pat. No. 5,160,869 Nakahata et al. Proof-of-concept devices have also been demonstrated for operation up to 4.7 GHz. However, in order for the ZnO/diamond structure to be commercially viable, device improvements are still required. Many of the current device performance issues are related to the material properties of the ZnO/diamond structure. These are related to the structural, mechanical and electrical properties of ZnO/diamond films.

The commercial viability will typically be determined by whether the electromechanical coupling and propagation loss are improved to the levels required for commercial device performance. Electromechanical coupling is strongly influenced by the c-axis orientation of the ZnO, the resistivity of the ZnO and the polarity of the ZnO grains. The propagation loss is influenced by the c-axis orientation, the surface roughness, the resistivity, the grain size and the grain boundary integrity.

The development of high quality ZnO/diamond for high frequency applications has unique challenges that were not required for the development of ZnO materials at lower frequencies. The first challenge is that the material properties are strongly influenced by the substrate for ZnO deposition. Diamond is desirable due to its high sound velocity. As with any material selection, there are also substrate issues that pose unique obstacles. The surface energy of diamond is extremely high. This makes adhesion of materials to this surface difficult. It also strongly influences the nucleation of ZnO on diamond, which may affect the orientation of the ZnO grains. Additionally, oxygen, which is present in the deposition of ZnO, promotes the formation of graphite when diamond is exposed to energetic environments. A second challenge that was not as stringent for low frequency applications is the propagation loss ($\alpha$) which has a frequency dependence. The propagation loss follows the general expression of $\alpha = Df^2$ where D is a constant and f is the frequency.

With respect to resistivity, an important difference occurs for ZnO/diamond relative to the prior art. For the devices in the prior art, the resistivity, and hence piezoelectric performance, is typically sufficient for high frequency operation (>100 MHz). It was in the area of low frequency operation [see, e.g., U.S. Pat. No. 4,164,676] that the resistivity and piezoelectric performance needed to be improved for commercial applications. For the structure of ZnO/diamond, the device performance is not sufficient for device applications and additional improvements are required for high frequency operation.

The use of dopants to ZnO have also been used to enhance epitaxy. Dopants of Ni, Fe and Cu were selected for epitaxial deposition of ZnO on sapphire. (See, for example U.S. Pat. Nos. 5,432,397 and 5,532,537). In this device configuration, it may be desirable to orient the c-axis parallel to the sapphire substrate (the c-axis was perpendicular to the substrate in prior art structures). The use of compositional changes has also been investigated for epitaxial ZnO/diamond. For example, Li doping has been investigated to produce highly resistive epitaxial films on (111) diamond. Carbide formers on diamond, such as Ta, Mo, Zr, Y, Sc, Nb, Hf, W and Si, may also be suitable dopants. Additionally, isoelectronic traps such as Ge, C, Sn and Pb may also be valuable.

As described above, ZnO/diamond is a promising material for high frequency SAW and BAW applications. Composition modifications may also provide effective strategies for improving the properties of ZnO. Unfortunately, the deposition of ZnO is strongly influenced by the substrate. Additionally, the material requirements are more stringent for higher frequency operation. It is also difficult to know a priori what result compositional specific changes have on the performance of ZnO. Therefore, it is desirable to investigate and identify compositional dopants that are suitable for the optimization of ZnO/diamond to produce devices with sufficiently low losses so that they are suitable for commercial applications.

SUMMARY OF THE INVENTION

This invention combines the elements of other piezoelectric structures to produce a structure demonstrating improved performance for high frequency applications. According to one embodiment of the present invention, a surface acoustic wave (SAW) device is provided. The SAW device comprises a diamond or quartz substrate as a wave propagation layer, a piezoelectric layer on the wave propagation layer and at least one interdigitated electrode on the piezoelectric layer. The piezoelectric layer comprises $Zn_{(1-x)}Y_xO$ wherein Y is selected from the group consisting of Group VI, VII, VIII, IX or X elements and x ranges from 0.5 to 16 atomic percent. Preferably Y is Ni. The nucleation and growth of piezoelectric materials is extremely substrate dependent and, as determined by the inventors herein, the incorporation of Y and combination of elements at the aforementioned levels into the ZnO film on a diamond or quartz layer produces significant structural, mechanical and electrical benefits.

For multilayer SAW devices which comprise polycrystalline ZnO on diamond, the resultant device structure can benefit from having a plurality of piezoelectric layers as a composite ZnO film, each with varying materials properties based on varying concentrations and types of preferred Y. As determined by the inventors herein, it is advantageous to adjust the level of Y in the $Zn_{1-x}Y_xO$ to form discrete layers.

As described above, there are certain general materials properties required for high performance in both surface and bulk acoustic wave devices. These general properties include having low propagation loss and high piezoelectric coupling for surface devices and low dielectric loss and strong coupling for bulk devices. The addition of Ni and other elements to ZnO, particularly in the case for polycrystalline ZnO on polycrystalline diamond, typically has pronounced effects on individual materials properties that contribute to both loss and coupling.

In particular, high resistivities are typically required to prevent shunt resistance and dielectric losses. This is especially true for thin film resonators, a specific type of bulk acoustic device, operating at high frequencies. The piezoelectric layer of the invention can have a resistivity greater than $10^7$ Ohm-cm. The addition of Y can also be used to increase the bulk resistance of polycrystalline ZnO films. Incorporation of Y into the ZnO lattice also improves grain boundary integrity and grain size uniformity. Improvements in these areas can significantly lower the losses in acoustic devices.

Piezoelectric coupling is an important parameter for both surface and bulk acoustic devices. Establishing a common polarity and high degree of texture for the deposited film are necessary components of a piezoelectric film for these applications. Incorporation of Y at levels between 0.5–16 atomic percent improves both polarity and texture through interface reaction with the diamond or quartz substrate.

In another embodiment of the present invention, a bulk acoustic wave (BAW) device is provided. The BAW device comprises a substrate such as AIN, SiC, GaN, silicon, glass, quartz, sapphire, diamond, GaAs, cordierite and cBN, an acoustic isolation means on the substrate, and a piezoelectric layer on the acoustic isolation means. The piezoelectric layer comprises $Zn_{(1-x)}Y_xO$ wherein Y is selected from the group consisting of Group VI, VII, VIII, IX or X elements and x ranges from 0.5 to 16 atomic percent.

DETAILED DESCRIPTION OF THE INVENTION

Figure 1A:
FIGS. 1A and 1B are TEM and SEM micrographs of $Zn_{(1-x)}Ni_xO$ where x is 0.037.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In the drawings, the thickness of layers and regions are exaggerated for clarity. Like numbers refer to like elements throughout and prime notation is used to indicate like elements in various embodiments.

One embodiment of the present invention is a SAW device comprising a diamond or quartz wave propagation layer, a piezoelectric layer on the wave propagation layer and at least one wave propagation layer and at least one interdigitated electrode on the piezolectric layer. The piezoelectric layer comprises $Zn_{(1-x)}Y_xO$ wherein Y is selected from the group consisting of Group VI, VII, VIII, IX or X elements and x ranges from 0.5 to 16 atomic percent. In a preferred embodiment Y is Ni. Preferably the diamond substrate layer is a highly oriented diamond layer comprising a plurality of side-by-side columnar diamond grains each oriented relative to one another and with a tilt and azimuthal misorientation of less than about 80°. Preferably the quartz substrate layer is a crystalline quartz material having a cut angle and a propagation direction which provides a negative value of temperature coefficient of delay such as described in U.S. Pat. No. 5,719,538, the disclosure of which is incorporated herein by reference in its entirety.

The interdigitated electroded is made from a material selected from the group consisting of Al, Cu, Al/Cu alloys, Pt, Au, Ti, Ta, W, Ni, Ha, Cr, Mo, Pd, Ag, Ir and alloys thereof. The material is selected to provide an acoustic impedance match between the piezoelectric layer 30 and the wave propagation layer 15. Additionally it should have a sufficient mass to clamp the piezoelectric layer 30 so that piezoelectrically developed stress is substantially imported to the wave propagation layer 15.

Figure 1B:
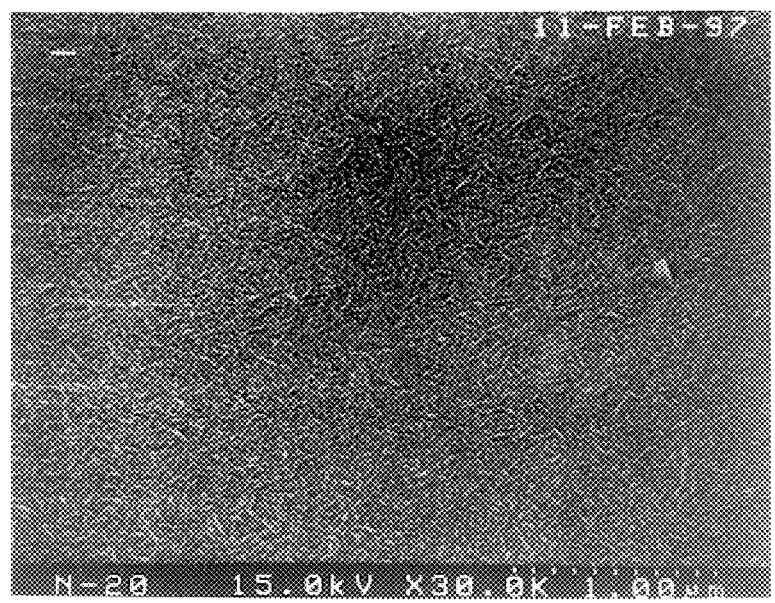
Figure 2A:
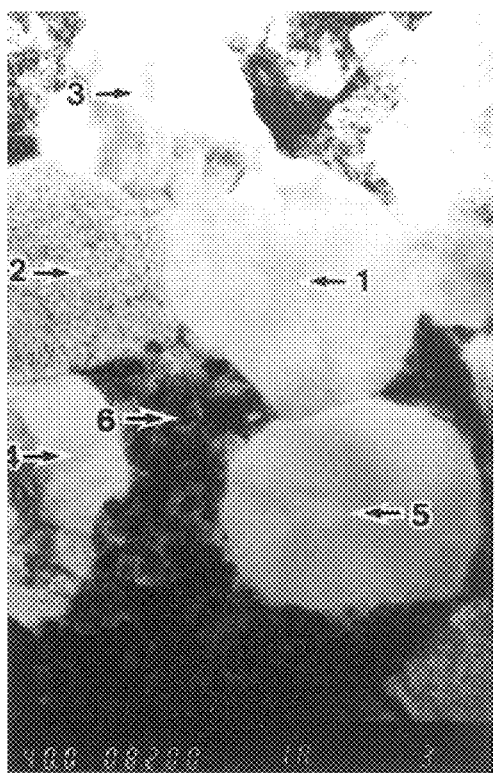
FIGS. 2A and 2B are TEM and SEM micrographs of ZnO.
Figure 2B:
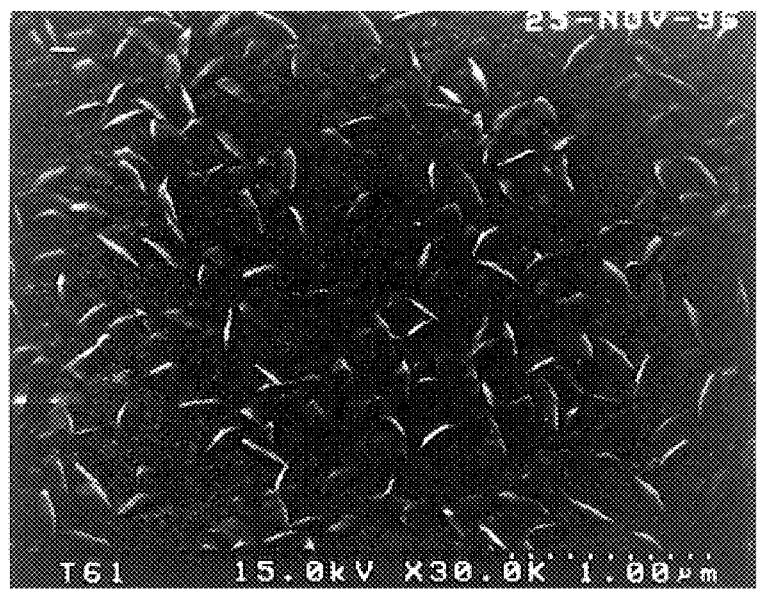

A preferred advantage of $Zn_{(1-x)}Y_xO$ is the improvement in the piezoelectric performance which results from the improved structural, mechanical and electrical properties. These improvements may be the result of the actual incorporation of Y into the film or in the ability to fabricate the ZnO film under processing conditions that produces a higher quality of film. Structurally, the incorporation of Y in the ZnO produce a better c-axis orientation of the film. This is clearly demonstrated in the TEM micrographs of FIG. 1A. Without the incorporation of Y (in this case Ni), a mixed morphology of large grained (>100 nm), non c-axis oriented material and small grained c-axis oriented material was observed. With the inclusion of Y, a homogeneous film of fine c-axis oriented grains (<100 nm) was produced. The homogeneity of the film morphology is best demonstrated by the SEM micrographs of FIG. 1B. For a ZnO film (FIG. 2B), the mixed morphology is clearly visible while for $Zn_{(1-x)}Y_xO$ (FIG. 1B), the film morphology is similar across the entire micrograph. A second benefit of the incorporation of Y in the ZnO film is that consistent grain nucleation and the resulting morphology can be achieved on various materials.

Mechanically, the use of $Zn_{(1-x)}Y_xO$ on diamond or quartz produces several benefits. One benefit is the higher velocity (and higher frequency operation) and another is the more efficient generation and propagation of acoustic waves. A summary of the sound velocity for various substrate materials in shown in Table 1.

TABLE 1

| Material | Sound Velocity (m/s) |
|---|---|
| Diamond | 18,000 |
| Sapphire | 12,000 |
| Quartz | 5900 |
| $LiNbO_3$ | 3600 |
| ZnO | 3500 |
| Soda Glass | 1600 |

For devices with equivalent geometry, the material with higher sound velocity produces a higher frequency device. Therefore, the use of $Zn_{(1-x)}Y_xO$ on diamond is advantageous over $Zn_{(1-x)}Y_xO$ on other substrate materials due to its ability to operate at higher frequencies. The $Zn_{(1-x)}Y_xO$ on diamond also produces a better mechanical structure for the generation and propagation of acoustic waves. The improved c-axis structure for $Zn_{(1-x)}Y_xO$ films mentioned above produces a more efficient electromechanical coupling coefficient and hence a more efficient propagation generation of an acoustic wave. The wave propagation is also affected by the morphology. The $Zn_{(1-x)}Y_xO$ films have a morphology that suggests more intimately connected grains that results in better grain boundary integrity. The improved mechanical integrity of the grain boundaries is believed to be one of the reasons for the reduced propagation loss of $Zn_{(1-x)}Y_xO$ films on diamond. The $Zn_{(1-x)}Y_xO$ films also have a better adhesion and surface roughness than ZnO films. An additional mechanical benefit of $Zn_{(1-x)}Y_xO$ is that the use of Y or combinations of Y can modify the stress state and coefficient of thermal expansion of the ZnO. This can be expected to alter the frequency temperature coefficient of the resulting device.

Figure 3:
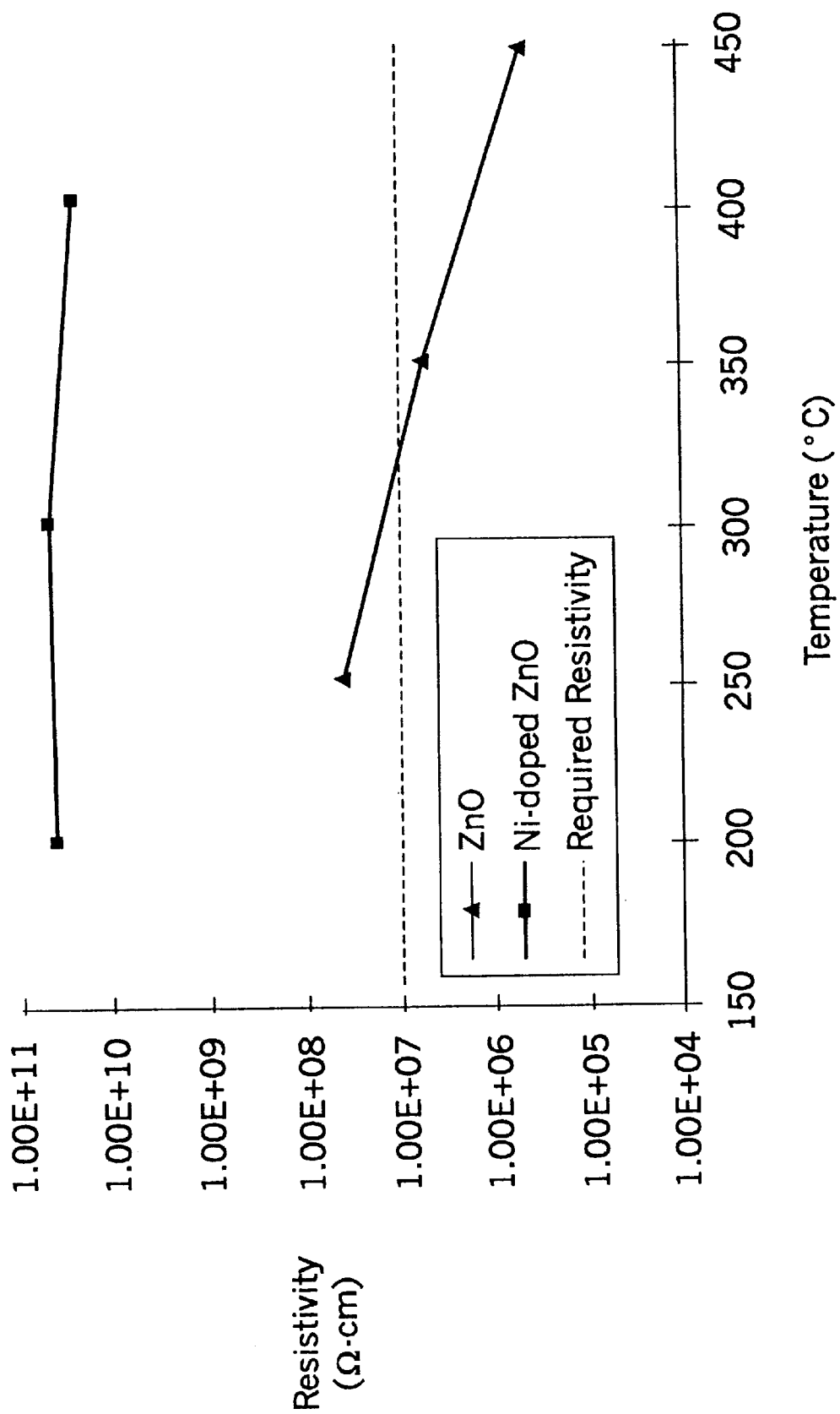
FIG. 3 is a graph comparing resistivity of ZnO piezoelectric with Ni and ZnO piezoelectric without Ni.

Electrically, it is important for the piezoelectric layer to have a high resistivity to minimize the dielectric losses. Leakage currents through the device will reduce the bias across the device which will limit the acoustoelectric coupling and will also generate propagation losses as the acoustic wave tranverses the ZnO. The improved resistivity of $Zn(1-x)Y_xO$ relative to ZnO is best demonstrated by a comparison of the resistivity as a function of deposition temperature as shown in FIG. 3. The resistivity of the $Zn_{(1-x)}Ni_xO$ is $>10^3$ times the resistivity of the ZnO over the temperature range of 200–450° C. The use of $Zn_{(1-x)}Y_xO$ increases the resistivity of the ZnO and also allows for the use of process parameters that were not realizable without the addition of Y due to the low resistivity of the resulting films. Typically the resistivity is greater than $10^7$ Ohm-cm.

Some of the improvements discussed above are realized by the incorporation of Y in the ZnO and some of the improvements are due to the ability to deposit the ZnO film with a set of process parameters that are viable with the use of $Zn_{(1-x)}Y_xO$ films. For example, the low resistivity in ZnO is likely due to excess Zn residing at interstitial sites in the lattice. In the absence of a compensating Y, it is necessary to have an argon/oxygen ambient in the process chamber to produce a high resistivity film. As the temperature is increased, higher oxygen concentrations are required to maintain a sufficient resistivity for device operation. The use of $Zn_{(1-x)}Y_xO$ to compensate for excess Zn allows for lower concentrations of oxygen to be used during fabrication while maintaining the film resistivity. The use of $Zn_{(1-x)}Y_xO$ expands the possible processing regime relative to ZnO, to optimize the deposition conditions.

The addition of Ni as Y in the deposition of $Zn_{(1-x)}Y_xO$ diamond has been shown to improve such properties as resistivity, grain boundary integrity, adhesion, and texture. Because of the delocalized nature of the d-shell electron in several of the Group 8, 9 and 10 elements in the periodic table, these elements (e.g., Fe, Co, Pd Ir and Pt) will easily give up extra electrons thus compensating for a deficiency in oxygen within the ZnO lattice. Such a compensation may make it easier for one to process at lower partial pressures of oxygen in the gas phase thus improving overall film quality while maintaining high resistivities. Data has shown that lower oxygen concentrations have resulted in higher film textures usually at the expense of maintaining high resistivities. The addition of small concentrations of such elements might improve the resistivities and the overall versatility in process development. Y being Cu and Al also have additional advantages. Both of these elements have very weak affinities for carbon as does Zn, however they possess low ionicities. With such a substitution, one can process at lower partial pressures of oxygen or even vary the resistivity without altering significantly the crystalline quality. Similarly, one could utilize substitutional oxygen elements such as phosphorous or sulphur. Phosphorous, which has one less bonding state relative to oxygen, helps to compensate for interstitial Zn donors that are a common conducting defect in ZnO. Sulphur has a similar bonding structure to that of oxygen, however its increased atomic radii should help to eliminate the occurrence of interstitial Zn defects through lattice distortion and strain fields.

The ionic crystal radii and the ionization state of transition metal species have also been determined to be suitable as Y for $Zn(_1x,)Y_xO$. The ionization state for zinc is $Zn^{2+}$ and the ionic crystal radii for $Zn^{2+}$ is 0.6–0.69 Å depending on coordination number. The transition metals with 2+ ionization state and ionic radii (r) in the range of 0.40 Å<r<0.90 Å are listed in the table below.

| Transition Metal $M^{2+}$ | Ionic Radii [Å] |
|---|---|
| $Cr^{2+}$ | 0.73 |
| $Cu^{2+}$ | 0.63–0.73 |
| $Fe^{2+}$ | 0.63–0.77 |
| $Mg^{2+}$ | 0.49–0.72 |
| $Mn^{2+}$ | 0.67 |
| $Ti^{2+}$ | 0.86 |
| $V^{2+}$ | 0.79 |
| $Cd^{2+}$ | 0.84 |

The Y concentration required for ideal nucleation (especially for polycrystalline piezoelectrics grown on polycrystalline substrates) may differ from that required for ideal bulk film properties. Thus, it may be necessary to vary the Y concentration throughout the film to achieve the desired properties. To this end one can utilize a series of discrete layers such as two layers, one for nucleation and one for depositing the bulk of the film. At nucleation, texture and polarity are a greater issue than grain boundary integrity. Therefore, one may use a Y level that optimizes the former and then switch to a concentration level that maintains high texture and polarity but favors grain boundary and bulk density. This concept can be further enhanced through the addition of a transition layer to provide smooth Y and materials properties transition from one layer to the next in order to avoid abrupt transition and sources of reflection and loss.

The correlation of these properties to the device performance have previously been discussed; therefore, the preferred values of these properties for $Zn_{(1-x)}Y_xO$/diamond structures for high frequency operation are summarized in the table below.

| Property | Preferred Value |
|---|---|
| c-axis orientation | >90% of the grains |
| polarity | >90% of the grains |
| surface roughness | <100 Å |
| density | interlocking structure |
| resistivity | >10$^7$ Ohm-cm |
| grain size | <100 nm |

Piezoelectric device performance depends primarily on the insertion loss which consists of the electromechanical coupling loss and acoustic wave propagation loss. As discussed above, the use of $Zn_{(1-x)}Y_xO$ produces structural, mechanical and electrical changes in the ZnO on diamond device structure. The use of diamond, relative to other materials, produces faster wave velocities than can be attained with other materials. The use of $Zn_{(1-x)}Ni_xO$ on diamond allows for device performance to be realized that was not achieved by these elements without the incorporation of the dopant. The primary device performance features are shown in the table below along with the preferred value or operational regime.

| Device Performance | Preferred Value/Regime |
|---|---|
| propagation loss | <0.04 dB/λ |
| wave velocity | >8000 m/s |
| electromechanical coupling | 0.01–7% |
| frequency temperature coefficient | <40 ppm/C |
| ZnO layer thickness | 0.1–10 μm |

In another embodiment of the present invention, a bulk acoustic wave (BAW) device is provided. The BAW device comprises a substrate such as AlN, SiC, GaN, silicon, glass, quartz, sapphire, diamond, GaAs, cordierite and cBN, an acoustic isolation means on the substrate, and a piezoelectric layer on the acoustic isolation means. The piezoelectric layer comprises $Zn_{(1-x)}Y_xO$ wherein Y is selected from the group consisting of Group VI, VII, VIII, IX or X elements and x ranges from 0.5 to 16 atomic percent.

As would be readily understood by those skilled in the art, features of the various SAW device embodiments described above may be readily used in other embodiments. For example, the highly oriented diamond may be used in each of the devices including the SAW filter, chemical sensor, phase shifter, convolver, and amplifier. Other signal processing devices, such as delay lines, and resonators are also contemplated by the invention. Accordingly, many modifications and other embodiments of the invention will come to one skilled in the art having the benefit of the teachings presented in the foregoing descriptions and the associated drawings. Therefore, it is to be understood that the invention is not to be limited to the specific embodiments disclosed, and that modifications are intended to be included within the scope of the appended claims.

That which is claimed:

1. A surface acoustic wave device comprising
   a diamond or quartz wave propagation layer;
   a piezoelectric layer on said wave propagation layer, said piezoelectric layer comprising $Zn_{(1-x)}Y_xO$ wherein Y is selected from the group consisting of Group VI, VII, VIII, IX or X elements and x ranges from 0.5 to 16 atomic percent; and
   at least one interdigitated electrode on said piezoelectric layer opposite said wave propagation layer.

2. A surface acoustic wave device according to claim 1, wherein said diamond wave propagation layer is a highly oriented diamond layer comprising a plurality of side-by-side columnar diamond grains which are each oriented relative to one another and have a tilt and azimuthal misorientation of less than about 8°.

3. A surface acoustic wave device according to claim 1, wherein said quartz wave propagation layer comprises a crystalline quartz material having a cut angle and a propagation direction which provide a negative value of temperature coefficient of delay.

4. A surface wave acoustic device according to claim 1, wherein said piezoelectric layer has a resistivity greater than 10$^7$Ohm-cm.

5. A surface acoustic wave device comprising
   a diamond or quartz wave propagation layer;
   a piezoelectric layer on said wave propagation layer, said piezoelectric layer comprising $Zn_{(1-x)}Ni_xO$ wherein x ranges from 0.5 to 16 atomic percent; and
   at least one interdigitated electrode on said piezoelectric layer.

6. A surface acoustic wave device according to claim 5, wherein said diamond wave propagation layer is a highly oriented diamond layer comprising a plurality of side-by-side columnar diamond grains each oriented relative to one another and with a tilt and azimuthal misorientation of less than about 8°.

7. A surface acoustic wave device according to claim 5, wherein said quartz wave propagation layer comprises a crystalline quartz material having a cut angle and a propagation direction which provide a negative value of temperature coefficient of delay.

8. A surface wave acoustic device according to claim 5, wherein said piezoelectric layer has a resistivity greater than 10$^7$Ohm-cm.

* * * * *